APPARATUS FOR BENDING THE LEADS OF ELECTRONIC COMPONENTS

Filed July 1, 1963

INVENTOR.
RHUBIN HALES
BY Lynn H Latta
ATTORNEY

United States Patent Office 3,267,716
Patented August 23, 1966

3,267,716

APPARATUS FOR BENDING THE LEADS OF ELECTRONIC COMPONENTS

Rhubin Hales, 4540 Don Diego Drive, Los Angeles 8, Calif.

Filed July 1, 1963, Ser. No. 291,620
5 Claims. (Cl. 72—384)

This invention relates to forming tools and has as its general object to provide a device for bending the terminal leads of electronic components such as diodes, transistors, resistors, capacitors, etc.

In the wiring of electronic circuit panels, especially in the case of printed circuits, it has become standard procedure to provide pairs of apertures in the panel at respective ends of each space provided for reception of a component, to bend the terminal leads of the component at right angles to the longitudinal axis of the component so as to bring them into parallel relation, to project the parallel leads through the apertures, and to solder the unbent portions of the leads to open ends of conductors on the surface of the panel so as to connect the component into the circuit. In the past, it has been common practice to bend the leads individually by hand, using a pair of electrician's pliers, and such practice has been time consuming, tedious and expensive. Furthermore, it is subject to inaccuracies on the part of the workman and in some instances where the bend is not properly made or positioned, a good connection to the underlying open ended conductor may not be obtained.

With the foregoing problems in mind, the invention embraces the following objects:

(1) To provide a device for bending a pair of terminal leads with accuracy and uniformity in the form and position of the bends.

(2) To provide a device for simultnaeously bending the terminal leads of a plurality of components while maintaining such uniformity and accuracy in all of them.

(3) To provide a device by which the terminal leads of electronic components can be accurately formed with rapidity such as to very substantially reduce the labor cost involved in bending the leads.

(4) To provide an apparatus for bending the terminal leads of electronic components into precise parallelism and spacing such as to facilitate and speed up the assembly operation of threading the leads through the prepunched apertures of a circuit panel, thereby reducing the cost of assembly.

(5) To provide an apparatus for bending terminal leads effectively without pinching off or shearing the leads in the bending device.

Other objects and advantages will become apparent in the ensuing specification and appended drawing in which.

Figures 1, 2, 3, 4:
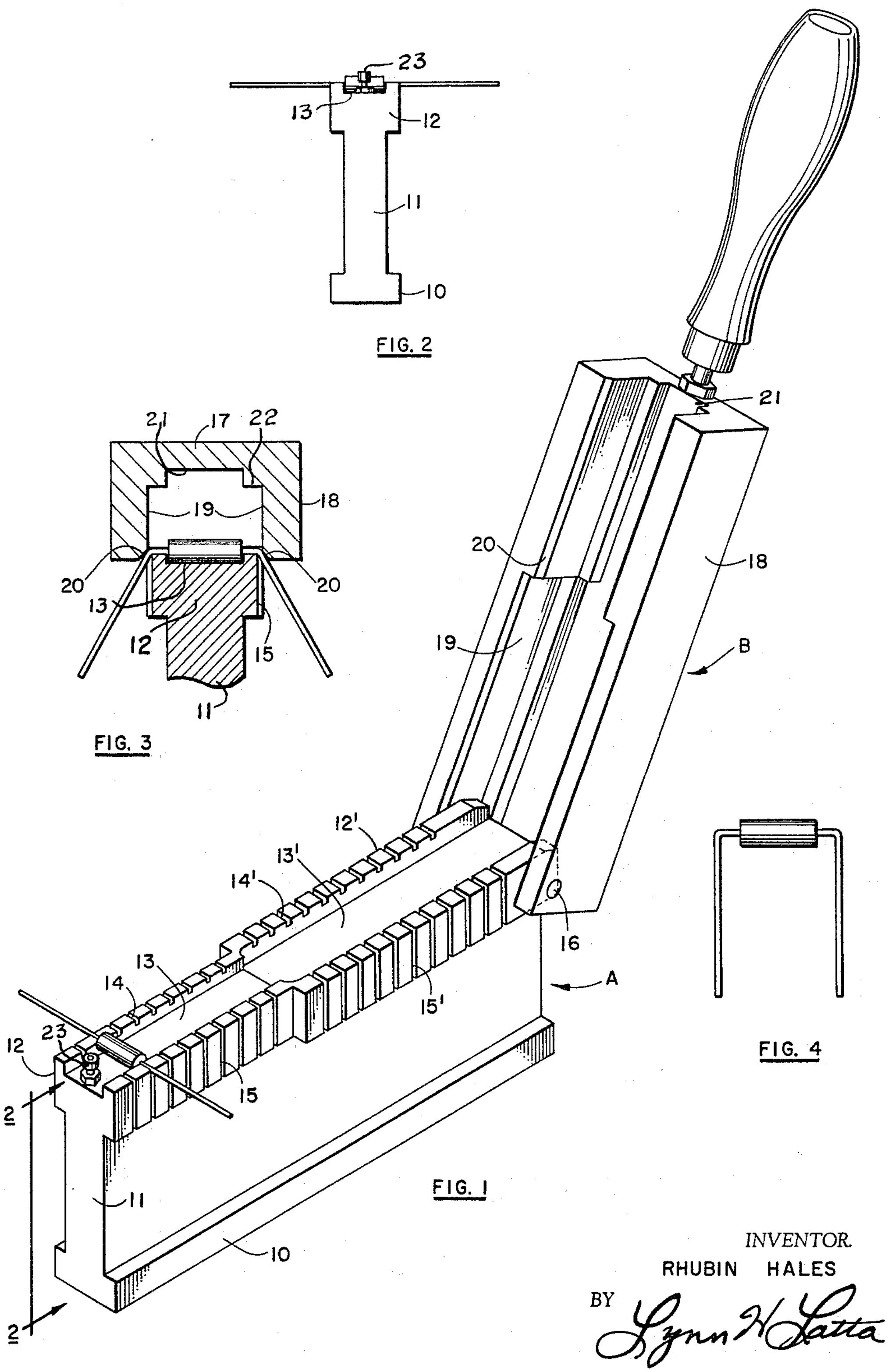
FIG. 1 is a perspective view of a tool embodying my invention, shown in an open position.
FIG. 2 is a front end view of the anvil portion of the tool, viewed as indicated by the line 2—2 of FIG. 1.
FIG. 3 is a cross-sectional view of the tool in an intermediate stage of closing of the bending head over the anvil.
FIG. 4 is a side view of an electronic component with its leads fully bent.

Referring now to the drawing in detail, I have shown therein, as an example of one form in which my invention may be embodied, a bending tool comprising, in general, an anvil A and a bending head B which is generally of channel form, having a handle at one end and having its other end hinged to the back end of the anvil A in a manner such that the head can be swung forwardly and downwardly over the anvil A to effect the bending of the leads of a plurality of electronic components laid across the top of the anvil.

The anvil A is of I-section, embodying a flanged base 10 which may be clamped down upon a work bench or other horizontal supporting surface; a web 11 projecting upwardly from the base 10; and a die-head 12, 12' extending along the length of web 11 at the top thereof. Die-head 12 is in the form of a shallow channel having a narrower forward section 12 and a wider rearward section 12', these sections having respective longitudinal channel recesses 13, 13' adapted to receive the cylindrical body portions of electronic components, one of which is disclosed resting upon the die-head section 12. The recess 13 is dimensioned to receive the bodies of smaller components and the recess 13', which is somewhat wider, is designed to receive the body portions of longer components. The recess 13' is somewhat deeper than the recess 13 so that it will accommodate components of larger diameter than those received by the recess 13.

The die head sections 12, 12' have respective vertical outer side faces which are provided with respective plural series of vertical slots 15, 15'. The slots 15, 15' are shallow, having a depth just slightly greater than the diameter of the terminal leads which they are designed to receive as the leads are bent downwardly. This is best indicated in FIG. 3 where the depth of the slots 15, 15' are shown as being approximately the same as the diameter of the terminal leads. The vertical side faces of the respective die head sections 12, 12' are more closely spaced in the head section 12 and more widely spaced in the head section 12', so that the leads of the larger components bent in the head section 12' will be more widely spaced than those bent in the head section 12. The slots 15, 15' on one side of the anvil are each aligned with a respective slot 15 or 15' on the opposite side, in a common plane at right angles to the longitudinal axis of the anvil.

In the side flanges of the channel sections 12, 12' which project upwardly from the floors of the recesses 13, 13', there are provided respective pairs of transverse slots 14, 14', each pair of transverse slots being transversely aligned and disposed in the common plane of a respective pair of vertical slots 15, 15' and in open communication with the upper ends thereof. The transverse slots 14, 14' function to receive the respective leads of electronic components adjacent the ends of the body portions of the components, so as to position the leads for bending action by the bending head B. The component shown near the forward end of the anvil in FIG. 1 is disclosed thus positioned with its respective leads resting in an aligned pair of transverse slots 14.

The bending head B has one end thereof hinged to the rear end of die head section 12' by a pair of aligned pivots 16 so that the head B can be brought forwardly and downwardly over the die head 12, 12'.

The bending head B is of channel section comprising a back web 17 and side wings 18 having opposed, parallel flat inward faces 19 for forming engagement with the leads to be bent, and having chamfers 20 along the free edges of forming walls 19. There are two pairs of the forming walls 19, namely, a more widely spaced pair adapted to snugly embrace the vertical side walls of the wider die head 12', and a more narrowly spaced pair adapted to snugly embrace the vertical side faces of the narrower die head 12. The chamfers 20 function to initiate the bending of the leads with a freedom from shearing action as best illustrated in FIG. 3. When the leads have been bent to the extent indicated in FIG. 3, the balance of the forming operation will be effected by the obtuse corners defined between the chamfers 20 and the parallel walls 19, followed by an "ironing" action of the walls 19 against the bent portions of the leads, in which the latter will be pressed snugly into the vertical slots 15, 15'.

In the web 17 there is provided a shallow longitudinal head recess 21 in two sections, one of which is relatively narrow to conform to the width of recess 13, and the other being relatively wide to conform to the width of the recess 13'. The sides of recess 21 are defined by integral, inwardly projecting corner beads of rectangular section which also define respective shoulders 22 positioned to bottom against the upper faces of the die head 12, 12', pressing the unbent portions of the terminal leads firmly into the transverse slots 14, 14' and straightening them, if necessary, into alignment with the longitudinal axis of the components.

A stop screw 23 is threaded into the forward die head section 12 at the forward end thereof, in a position projecting upwardly from the bottom of recess 13. The stop screw 23 can be adjusted to selected heights so as to determine the closed position of the forming head B by contact of the forward end thereof against the top of the stop screw, contact being made by the inward face of web 17 at the top of the head recess 21. The stop screw 23 is provided with a lock nut thereon as shown, so that its selected position of adjustment can be fixed by locking the screw to the anvil A.

The most efficient use of the apparatus can be obtained by loading the anvil A with a series of resistors, one for each pair of transverse slots 14, with the respective leads resting in said slots and the respective central body portions received in the recesses 13 or 13' (or in both, where components of different sizes are to be worked simultaneously). Grasping the handle at the free end of bending head B, the operator brings the head forwardly and downwardly until it bottoms out by engagement against the stop screw 23. The entire series of leads will thus be bent downwardly to positions such as those shown in FIG. 4. Because of spring-back in the terminal leads, they will engage the parallel internal faces 19 of the bending head B with sufficient pressure to be held within the head B as the latter is lifted and swung rearwardly to its open position. The components can then be removed from the bending head, one by one and inserted into a circuit panel.

I claim:

1. Apparatus for bending the terminal leads of an electronic component having such leads projecting from opposite ends of a generally cylindrical body, comprising: an anvil having a die head of channel section including respective upwardly projecting side flanges defining between them a longitudinal recess to receive said central body portion and having transversely aligned slots adapted to receive said lead adjacent the ends of said body portion with the remainders of the leads projecting laterally outwardly from said flanges, said flanges further having vertical outer side faces provided with pairs of vertical slots registering with respective transverse slots and adapted to receive said projecting lead portions when bent downwardly; and a bending head of rigid channel section comprising a central back web and respective rigid side wings projecting therefrom in opposed parallel relation, said side wings having laterally opposed, parallel internal walls adapted to snugly embrace the vertical side walls of said die head, said bending head having one end thereof hinged to the rear end of said anvil on a transverse axis so positioned that said bending head may be swung downwardly over said die head, with said side wings engaging the projecting leads and bending them downwardly into said vertical grooves.

2. Apparatus as defined in claim 1, wherein the vertical outer side faces of said flanges are parallel to the longitudinal axis of said die head.

3. Apparatus as defined in claim 1, including an adjustable stop mounted in the forward end of said anvil and projecting upwardly from said die head and engageable by the free end of said bending head at the inner face of said back web, for limiting the closed position of said bending head with respect to said anvil.

4. Apparatus as defined in claim 1, wherein said wings of the bending head have respective chamfers along their forward margins, for initiating the bending action with a freedom from any shearing of said leads.

5. Apparatus as defined in claim 1, wherein the back web of said bending head is provided with a longitudinal recess for registration with the recess of said die head, to receive the upwardly projecting portions of the component bodies, said die head having inwardly projecting integral beads of rectangular section protruding inwardly from said internal walls of said wings, defining the side margins of said internal groove and also defining shoulders for mating engagement with the upper faces of said flanges of said die head.

References Cited by the Examiner

UNITED STATES PATENTS

| | | | |
|---|---|---|---|
| 1,108,493 | 8/1914 | Federspiel | 140—106 |
| 2,217,486 | 10/1940 | Larson | 72—384 |
| 2,407,040 | 9/1946 | Taramaschi | 72—387 |
| 2,777,477 | 1/1957 | Zimmerman | 140—71 |
| 2,878,475 | 3/1959 | Zimmerman | 140—71 |
| 3,122,826 | 3/1964 | Self | 140—71 |
| 3,142,484 | 7/1964 | Press | 269—303 |

CHARLES W. LANHAM, *Primary Examiner.*

L. A. LARSON, *Assistant Examiner.*